United States Patent
Draxelmayr et al.

(10) Patent No.: US 9,628,036 B2
(45) Date of Patent: Apr. 18, 2017

(54) SENSOR SIGNAL PROCESSING USING TRANSLINEAR MESH

(71) Applicant: Infineon Technologies AG, Neubiberg (DE)

(72) Inventors: Dieter Draxelmayr, Villach (AT); Simone Fabbro, Udine (IT)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 14/083,265

(22) Filed: Nov. 18, 2013

(65) Prior Publication Data

US 2014/0139289 A1  May 22, 2014

(30) Foreign Application Priority Data

Nov. 16, 2012 (EP) ..................................... 12425182

(51) Int. Cl.
*H03F 3/45* (2006.01)
*G01D 5/347* (2006.01)

(52) U.S. Cl.
CPC ....... *H03F 3/45632* (2013.01); *G01D 5/3473* (2013.01); *G01D 5/34715* (2013.01)

(58) Field of Classification Search
CPC .............................. H03F 3/45479; H03F 3/45
USPC ........................................ 330/258, 261, 253
See application file for complete search history.

(56) References Cited

U.S. PATENT DOCUMENTS

| | | |
|---|---|---|
| 5,331,289 A | 7/1994 | Price |
| 5,392,003 A * | 2/1995 | Nag .................... H03F 3/45076 330/254 |
| 5,907,261 A | 5/1999 | Jones |
| 6,084,471 A | 7/2000 | Ruth et al. |
| 6,559,720 B1 | 5/2003 | Huijsing et al. |
| 6,815,988 B2 | 11/2004 | Sanduleanu |
| 2002/0180506 A1* | 12/2002 | Tinsley ............ H03K 19/00376 327/307 |
| 2003/0034813 A1 | 2/2003 | Sanduleanu |
| 2007/0030070 A1 | 2/2007 | Brueske et al. |
| 2008/0009255 A1 | 1/2008 | Tan et al. |
| 2008/0160950 A1 | 7/2008 | Yang et al. |
| 2009/0237161 A1 | 9/2009 | Fagg |

FOREIGN PATENT DOCUMENTS

| | | |
|---|---|---|
| CN | 1213215 A | 4/1999 |
| CN | 1243615 A | 2/2000 |
| CN | 1541452 A | 10/2004 |
| CN | 101102097 A | 1/2008 |
| CN | 10212203 A | 7/2008 |
| CN | 101978598 A | 2/2011 |
| CN | 101807891 B | 6/2012 |

(Continued)

OTHER PUBLICATIONS

Futane et al., Analog ASIC for improved temperature drift compensation of a high sensitive porous silicon pressure sensor, Analog Integrated Circuits and Signal Processing, Jan. 8, 2011.

(Continued)

*Primary Examiner* — Patricia T Nguyen
(74) *Attorney, Agent, or Firm* — Shumaker & Sieffert, P.A.

(57) ABSTRACT

Apparatuses and methods are described where input signals are supplied to a translinear mesh. In some embodiments an output of the translinear mesh is regulated to a desired value.

22 Claims, 6 Drawing Sheets

(56) References Cited

FOREIGN PATENT DOCUMENTS

EP    0926820 A2    6/1999
EP    1096233 A2    5/2001

OTHER PUBLICATIONS

Extended Search Report from counterpart European Application No. 12425182.8, dated Aug. 1, 2013, 10 pp.
Partial Search Report from counterpart European Application no. 12425182.8, dated Apr. 16, 2013, 6 pp.
First Office Action and translation from counterpart Chinese Application No. 201310753554.4, dated Dec. 1, 2015, 25 pp.
Second Office Action and translation from counterpart Chinese Application No. 201310753554.4, dated May 25, 2016, 27 pp.
First Supplemental Search, in the Chinese language, from counterpart Chinese Application No. 201310753554.4, dated Oct. 21, 2015, 2 pp.
Second Supplemental Search, in the Chinese language, from counterpart Chinese Application No. 201310753554.4, dated Oct. 10, 2016, 2 pp.
Third Office Action and translation from counterpart Chinese Application No. 201310753554A, dated Oct. 31, 2016, 10 pp.

* cited by examiner

SENSOR SIGNAL PROCESSING USING TRANSLINEAR MESH

RELATED APPLICATIONS

This application claims priority benefit of European Patent Application 12425182.8, which was filed on Nov. 16, 2012. The entire contents of the European Patent Application are incorporated herein by reference.

BACKGROUND

The present application relates to processing of signals, for example signals delivered by sensors.

Sensors generally serve to convert some property to be captured, like a movement, into electrical signals. For example, some kinds of movement sensors use optical elements or magnetic elements to detect a rotary or linear movement. The strength of the electrical signals output by such sensors often depends on various circumstances during measurements, such that signal amplitudes and the like may vary. However, for further processing of such signals, it is often desirable to provide the signal with a defined signal strength, for example an amplitude or other property of the signal being in a desired range. Therefore, it is an object of the present invention to provide apparatuses and methods capable of providing such a constant signal strength.

BRIEF DESCRIPTION OF THE DRAWINGS

The detailed description is described with reference to the accompanying figures. In the figures, the left-most digit(s) of a reference number identifies the figure in which the reference number first appears. The use of the same reference number in different instances in the description and the figures may indicate similar or identical items.

DETAILED DESCRIPTION

In the following exemplary embodiments will be described in detail with reference to the attached drawings. It should be emphasized that the embodiments described serve only for illustration purposes and are not to be construed as limiting the scope of the present application.

Features of various embodiments described in the following may be combined with each other unless specifically noted otherwise. Furthermore, describing an embodiment with a plurality of features is not to be construed as indicating that all those features are necessary for practicing the present invention, as other embodiments may comprise less features and/or alternative features to the ones described or shown in the drawings. Furthermore, also additional features, elements or units known to persons skilled in the art may be incorporated into the embodiments explicitly described without departing from the scope of the present invention.

The attached drawings are to be regarded as schematic only, and the various elements are not necessarily shown to scale with each other.

In some embodiments described in the following, a translinear mesh is used to provide an automatic gain control for sensor signals, in particular a pair of sensor signals which are related such that when one signal increases, the other decreases and vice versa. In some embodiments, via a control loop or other control mechanism a common mode current of the sensor signals is regulated to a desired level.

In some embodiments, an apparatus is provided, comprising: a sensor arrangement or a signal input to receive signals e.g. from a sensor arrangement, a translinear mesh, an input of said translinear mesh being coupled to a sensor output of said sensor arrangement, and a control circuit to regulate a signal at an output of said translinear mesh to a predetermined signal strength.

Said sensor arrangement may include a further sensor output being coupled to a further input of said translinear mesh, and said translinear mesh may include a further output.

Said control circuit may be configured to regulate a common mode component of signals output at said output and said further output of said translinear mesh to a predetermined value.

Said sensor arrangement may be configured to output a first signal at said sensor output and a second signal at said further sensor output, wherein said first signal increases when said second signal decreases, and wherein said first signal decreases when said second signal increases.

Said translinear mesh may include a first transistor pair and a second transistor pair, said first transistor pair including a first transistor being scaled with respect to a second transistor of said first transistor pair, and wherein said second transistor pair includes a third transistor being scaled with respect to a fourth transistor of said second transistor pair.

Said control circuit may include a control loop, said control loop including a difference amplifier to compare a voltage depending on an output of the translinear mesh with a reference voltage.

Said control circuit may include at least one current mirror.

Said sensor arrangement may include a first array of sensors and a second array of sensors, sensors of said first array being arranged in an interleaving manner with sensors of said second array.

Said sensor arrangement may include a motion sensor.

Said sensor arrangement may include at least one of an optical sensor or a magnetic sensor.

The apparatus may further comprise signal conditioning circuitry.

In some embodiments, an apparatus is provided, comprising: a first signal input, a second signal input, a first transistor including a first terminal coupled to said first signal input, and wherein a second terminal of said first transistor is coupled to a first signal output, a second transistor including a first terminal coupled to said second signal input and a second terminal coupled to a second signal output, wherein a control terminal of said first transistor is coupled to a control terminal of said second transistor, a third transistor including a first terminal coupled to said first signal output, a second terminal coupled to a first biasing voltage, and a control terminal coupled to a second biasing voltage, and a fourth transistor including a first terminal of coupled to said second signal input, a second terminal coupled to said first biasing voltage, and a control terminal coupled to said second biasing voltage.

Said third transistor may be scaled by a factor of N with respect to said first transistor, and said fourth transistor may be scaled by a factor of N with respect to said second transistor.

The apparatus may further comprise a first cascode transistor arrangement coupled to said first signal output and a second cascode transistor arrangement coupled to said second signal output.

The apparatus may further comprise a first biasing current coupled to said control inputs of said first and second transistors.

The apparatus may further comprise a first current mirror coupled to said first signal output and a second current mirror coupled to said second signal output.

The apparatus may further comprise a third current mirror coupled in parallel to said first current mirror and a fourth current mirror coupled in parallel to said second current mirror.

The apparatus may further comprise a second biasing current coupled to voltage terminals of said third and fourth current mirrors.

Said first current mirror may include a first transistor pair, a first transistor of said first transistor pair being scaled by a factor of M with respect to a second transistor of said first transistor pair, and said second current mirror may include a second transistor pair, the first transistor of said second transistor pair being scaled by a factor of M with respect to a second transistor of said first transistor pair.

The apparatus may further comprise a differential transconductance amplifier, a first input of said differential transconductance amplifier being coupled to said first signal output and a second input of said differential transconductance amplifier being coupled to said second signal output, a first output of said differential transconductance amplifier being coupled to a first voltage output and a second output of said differential transconductance amplifier being coupled to a second voltage output.

The apparatus may further comprise a difference amplifier, a first input of said difference amplifier being coupled to a node between said first voltage output and second voltage output, a second input of said difference amplifier being coupled to a reference voltage and an output of said difference amplifier being coupled to said control input of said first transistor and said control input of said second transistor.

The apparatus may further comprise a first resistor coupled between said first input of said differential transconductance amplifier and said first output of said differential transconductance amplifier, and a second resistor coupled between said second input of said differential transconductance amplifier and said second output of said differential transconductance amplifier.

The apparatus may further comprise a sensor arrangement, a first output of said sensor arrangement being coupled to said first signal input and a second output of said sensor arrangement being coupled to said second signal input.

The apparatus may further comprise at least one adjustable current source coupled to said first signal input and said second signal input.

In some embodiments, a method is provided, comprising: providing an input signal to a translinear mesh, and regulating a common mode component of an output of said translinear mesh to a value.

Providing input signals may include capturing a motion using a motion sensor, and providing input signals corresponding to the captured motion to the translinear mesh.

The method may be implemented in any one of the apparatuses discussed above, but also independently therefrom.

Figure 1:
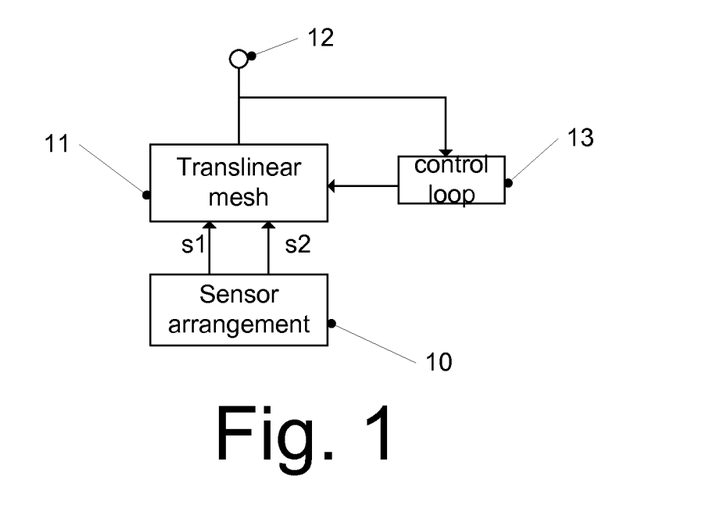
FIG. 1 is a schematic block diagram of an apparatus according to an embodiment.

Turning now the figures, in FIG. 1 a schematic block diagram of an apparatus according to an embodiment is shown. The apparatus of FIG. 1 includes a sensor arrangement 10, for example a sensor arrangement comprising a movement sensor, Hall sensor, other magnetic sensor or any other kind of sensor, which outputs signals s1, s2. In some embodiments, signals s1, s2 are related to each other such that when signal s1 increases (i.e. a voltage and/or a current etc. of signal s1 increases), signal s2 decreases and vice versa.

Signals s1, s2 may have a common mode component, for example a common mode current component, and a differential component. Signals s1 and s2 may be current signals, but may also be voltage signals in some embodiments. In some embodiments, in the case of voltage signals, a voltage-to-current conversion may be provided to generate current signals based on the voltage signals.

Signals s1, s2 are provided to a translinear mesh 11, which in some embodiments may be used together with a control loop 13 to output a signal at an output node 12 depending on signals s1, s2, where a common mode component of signals s1, s2 has been regulated to a desired reference signal level. A translinear mesh 11 is a circuit that includes elements which convert a linear behavior of a signal to a logarithmic or exponential behavior. Such elements may include bipolar transistors and/or may comprise field-effect transistors like metal oxide semiconductor field-effect transistors (MOS-FETs) operated in a sub-threshold region.

The signal provided at node 12 may then be further processed. In some embodiments, signals s1 and s2 may also be processed, for example conditioned, prior to feeding them to translinear mesh 11. Also, in some embodiments, instead of a single output node 12, two output nodes may be provided for outputting two output signals, for example one output signal being based on s1 and another output signal being based on s2.

It should be noted that an apparatus like the one shown in FIG. 1 which comprises a sensor arrangement 10 together with further components like translinear mesh 11 to process the output signals of sensor arrangement 10 to corresponding processed output signals available at an output like node 12 for the rest of a system or other components is also sometimes referred to as an encoder, for example a motion encoder in case sensor arrangement 10 comprises motion sensors.

Implementation examples of the various components of the embodiment of FIG. 1 will be described further below in greater detail.

Motion encoders, for example the apparatus of FIG. 1, typically rely on sensor arrays of many cells, for example photodiodes, where every single sensor cell may be stimulated by a corresponding emitter source like a light emitting diode or other light source.

Figure 2:
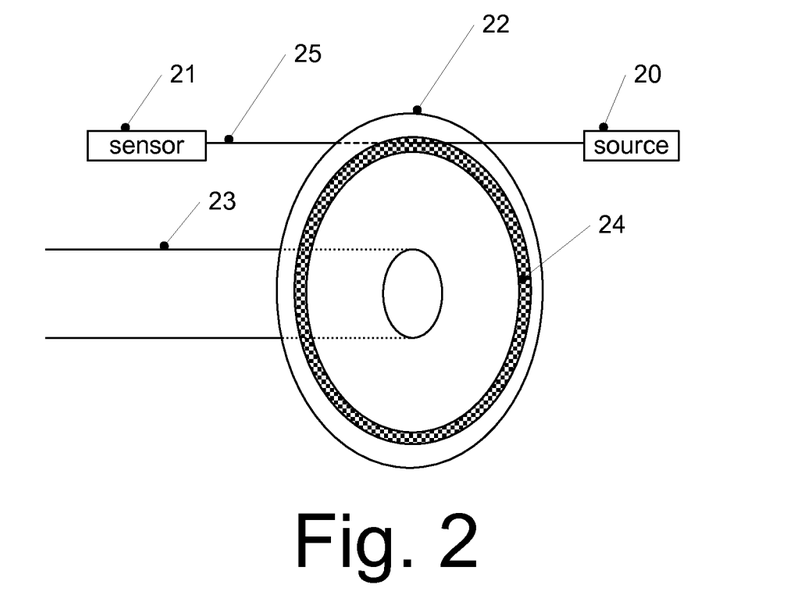
FIG. 2 is a schematic diagram illustrating a sensor arrangement usable in some embodiments.

An example sensor arrangement usable in some embodiments described herein will now be described with reference to FIG. 2. The sensor arrangement of FIG. 2 is a motion sensor arrangement for detecting a rotary motion of a shaft 23. To this end, a code wheel 22 including a circular code strip 24 is mounted at an end of shaft 23. Code strip 24 includes transparent portions and opaque opaqueportions. One or more light sources 20 emit one or more light beams 25 directed at code strip 24. Light beams 25 which fall on transparent portions of code strip 24 continue to one or more sensors 21. When code wheel 22 rotates together with shaft 23, the positions of the transparent and opaque opaqueportions change, which is registered on one or more sensors 21, thus enabling a detecting and quantification of the rotary motion. It should be noted that in general, instead of transparent and opaque portions, portions with different levels of transparency may be used in various embodiments, as long as corresponding sensors can detect the different levels of transparency.

It should be noted that while in case of FIG. 2 one or more light sources 20 and sensors 21 are stationary while a third element, in this case code wheel 22, is moving, thus modulating the light beams emitted by one or more light sources 20. In other embodiments, for example, sensors may be mounted on the code wheel 22 or light sources may be mounted on the code wheel 22 or other moving elements related to the moving part of interest.

Also, in other embodiments instead of optical sensors as shown in FIG. 2, magnetic sensors may be used. In the case of motion sensors, magnets may be mounted to the code wheel 22, and magnetic sensors like Hall sensors may be positioned adjacent to the code wheel to detect a change of the magnetic field caused by the moving of the code wheel 22 and thus of the magnets.

Figure 3:
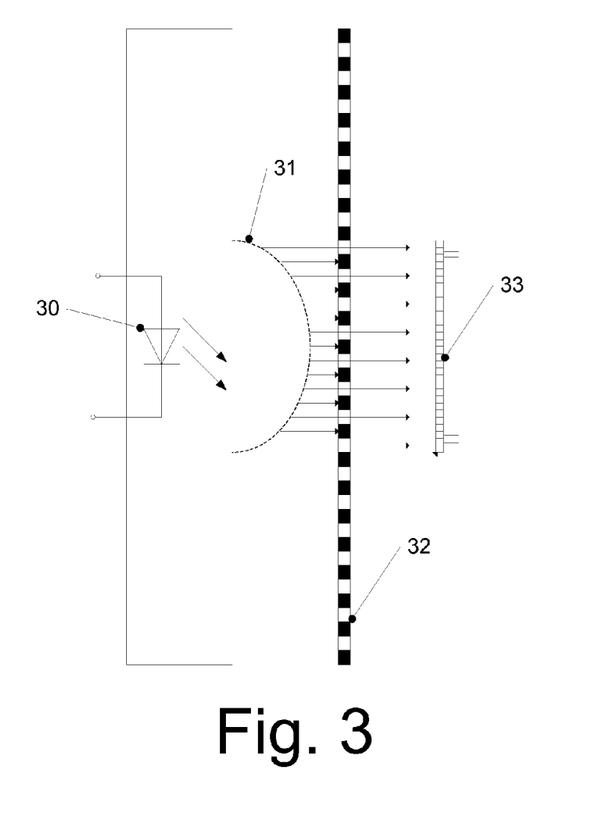
FIG. 3 is a schematic diagram illustrating a sensor arrangement usable in some embodiments.

In FIG. 3 a more detailed partial view of a motion sensor arrangement, a rotary motion sensor as shown in FIG. 2 or a linear motion sensor, usable in embodiments, is shown. In the sensor of FIG. 3, a code strip 32 is shown as having alternately transparent portions (shown in white) and opaque opaque portions (shown in black). Code strip 32 may be a code strip on a code wheel like code wheel 22 of FIG. 2 or may also be a linear code strip coupled to a linear moving element to detect a linear motion thereof. The sensor arrangement of FIG. 3 furthermore includes a light emitting diode 30 as a light source, which is embedded in a lens 31. Lens 31 generates essentially parallel light beams, as indicated by arrows falling on code strip 22. As schematically shown in FIG. 3, only portions of the light falling on transparent portions of code strip 32 pass through code strip 32 and fall on a photodiode array 33. Photodiode array 33 includes a plurality of photodiodes symbolized by squares in FIG. 3 which therefore enable a detection of the position of the transparent portions (where light falls on photodiode array 33) and opaque portions (where no light falls on photodiode array 33) and therefore enables a detection of a motion of code strip 32.

Figure 4A:
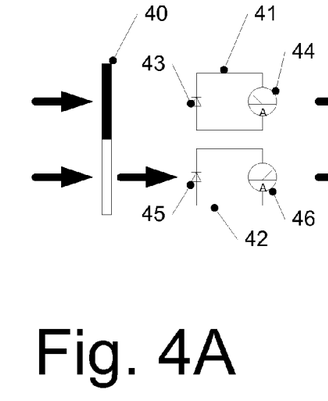
FIGS. 4A-4C are diagrams for illustrating the behavior of a sensor arrangement usable in some embodiments.
Figure 4B:
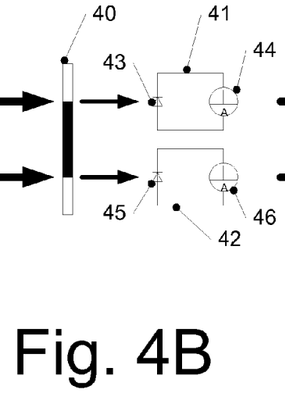
Figure 4C:
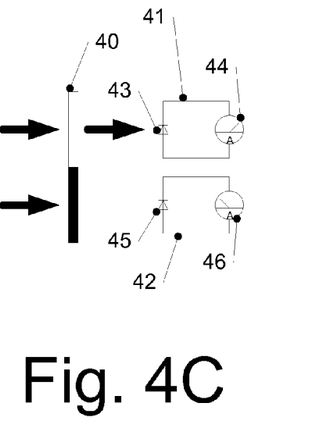

This detection of motion will be further explained with reference to FIGS. 4A-4C. FIGS. 4A-4C show a portion of a sensor arrangement like the sensor arrangement of FIG. 3, in particular two photodiode elements 41, 42. Photodiode element 41 includes a photodiode 43 and an evaluation symbolized by a current meter 44 indicating the photocurrent generated by photodiode 43. Likewise, photodiode arrangement 42 includes a photodiode 45 and an evaluation symbolized by a current meter 46. In FIGS. 4A-4C, a portion of a code strip 40 is shown, the position of which differs for each of the cases of FIGS. 4A, 4B and 4C.

In FIG. 4A, code strip 40 is positioned such that an opaque portion is located in front of photodiode 43, while a transparent portion is located in front of photodiode 45. Therefore, as indicated by arrows, photodiode 45 is illuminated, while photodiode 43 is not illuminated. Consequently, photodiode 43 generates no current, while photodiode 45 generates a high current.

In FIG. 4B, an opaque portion of code strip 40 is located in an intermediate position between photodiodes 43 and 45. Therefore, both photodiodes receive some light via the adjacent transparent portions, and both photodiodes 43, 45 generate an intermediate current. Finally, in the case of FIG. 4C an opaque portion of code strip 40 is in front of photodiode 45, while a transparent portion is in front of photodiode 43. Therefore, in the situation of FIG. 4C photodiode 43 generates a comparatively large current (similar to photodiode 45 in FIG. 4A), and photodiode 45 generates no current.

When code strip 40 moves continuously, as evident from the examples of FIGS. 4A-4C when a current delivered by photodiode 43 increases, a current delivered by photodiode 55 decreases and vice versa.

In order to detect and measure motion and speed with such a motion sensor arrangement in some cases at least two interleaved arrays of sensors are used. An example embodiment using such an interleaved array of sensors is schematically shown in FIG. 5.

Figure 5:
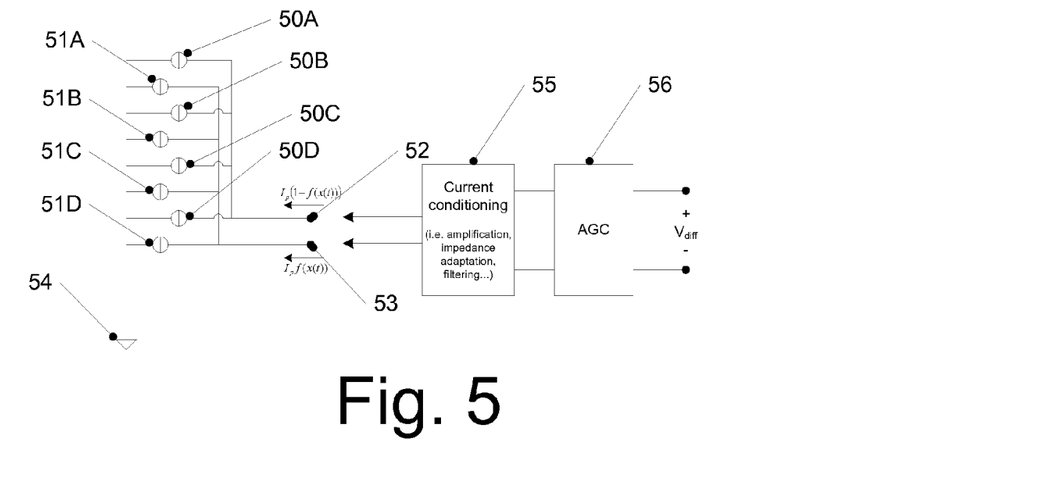
FIG. 5 is a schematic diagram of an apparatus according to an embodiment.

In the embodiment of FIG. 5, a sensor arrangement includes a first array of sensors 50A-50D, collectively referred to as sensors 50 or sensor array 50, and a second array of sensors 51A-51D, collectively referred to as sensors 51 or sensor array 51. While in the example of FIG. 5 each array of sensors includes four sensors, this is merely to be taken as an example, and any desired number of sensors may be provided depending on a resolution to be obtained. Sensors 50 and 51 may include optical sensors like photodiodes or phototransistors or magnetic sensors like Hall sensors, as explained above. In the example of FIG. 5, sensors 50, 51 are sensors generating a current depending on a quantity to be measured, for example depending on light falling on the sensors or a magnetic field acting on the sensors. One terminal of sensors 51, 50 is coupled to a bias voltage 52.

Second terminals of sensors 50 are coupled together such as to sum the output currents, and likewise second terminals of sensors 51 are coupled together to sum the output currents. Sensors 50, 51 are arranged in an interleaving manner, such that a sensor 50 from the first array of sensors is followed by a sensor 51 of the second array of sensors in a spatial arrangement. For example, when a code strip as explained above or a light source passes in front of the sensor arrangement, alternatingly, a sensor of the first array and a sensor of the second array is illuminated.

In the embodiment of FIG. 5 each sensor 50, 51 sends out a current once it is stimulated. For example, at a given point in time all sensors 50 may be stimulated by light (for example due to transparent portions of a code strip being in front of them), and therefore provide a maximum current, while sensors 51 are not illuminated, for example due to opaque portions in front of them, and therefore emit no current. When the code strip moves, a gradual change occurs, as already explained with reference to FIG. 4. The exact shape of the current generated by sensors 50, 51 may depend on the sensor response, on a response of an exiting element, on conditions of the system like the mechanical properties, on environmental conditions and on a degree of overlap between the two groups. In general, the output current $I_{50}$ of the first array of sensors 50 may be written as:

$$I_{50} = I_p(1 - f(x(t))) \tag{1},$$

and the output current $I_{51}$ of the second array of sensors 51 may be written as $$I_{51} = I_p f(x(t)) \tag{2},$$

wherein x(t) describes a position of a code strip or emitter depending on time, and f describes a functional relationship including the above-mentioned responses and the mechanical setups. In the case of a circular placement of sensors and emitters, the output response becomes periodic, for example in the case of a circular code strip 24 as shown in FIG. 2, a period p in the equations (1) and (2) above. $I_p$ represents a maximum current, and f in some embodiments fulfils the condition $$0 \leq f(x(t)) \leq 1 \tag{3}.$$

It should be noted that the situation which has been described with reference to FIG. 4, in particular a zero current emission in case an opaque portion is placed directly in front of a corresponding photodiode, represents an ideal case. Such an ideal case would correspond to a current behavior corresponding to a line 60 in FIG. 6, i.e. a periodic triangular signal. However, in real systems, a perfect illumination and perfect blinding of the sensors may not be possible. For example, due to physical limitations there will may be a part of radiation commonly illuminating all sensors or a kind of background radiation. This causes a continuous spurious baseline output signal proportional to the magnitude of this radiation. Generally, with a stronger radiation used for the sensor the stronger the baseline becomes, but also the useful signal becomes larger to the same extent. The total output of each sensor array or group, for example sensors 50 and sensors 51 in FIG. 1, may be split into a common mode (baseline) component and a differential component, the differential component being the component actually usable for motion encoding.

Figure 6:
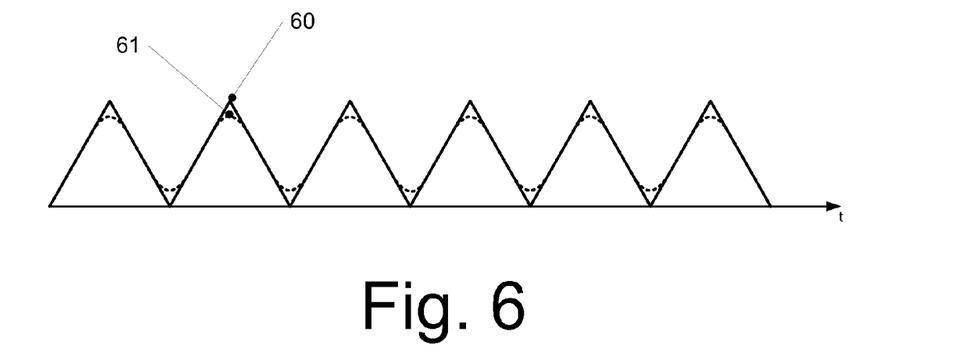
FIG. 6 is a diagram showing signal waveforms.

For example, in FIG. 6 a curve 61 schematically shows a real signal which generally does not drop to zero, but keeps a certain minimum level corresponding to the above-mentioned baseline. It should be noted that equations (1) and (2) still apply, as both common mode and differential components may be represented by the function f(x(t)). Depending on the physical implementation and limitations of the system, the ratio between differential component and common mode component may vary. However, for a specific implementation the ratio between these components may be at least approximately fixed. Therefore, in such cases both the common mode component and the differential component individually may serve as a measure for the overall signal strength.

It should be noted while in FIG. 5 the sensors output currents, the above explanations also apply to sensors outputting voltages. Moreover, voltages may be converted to currents by suitable voltage-to-current converters as known to persons skilled in the art, and therefore also the following explanations based on sensors generating currents may also be applied to sensors generating voltages combined with a corresponding voltage-to-current converter.

In the embodiment of FIG. 5, the output signals of sensors 50 and 51 are fed to a current conditioning block 55 which may perform processing of the signals by amplification, impedance matching, filtering and the like to make the signals better suitable for use by subsequent components.

Furthermore, depending on the implementation of mechanical system parts of the sensor arrangement and their wearing down with time and also depending on environmental conditions, the magnitude of the signals generated may vary over time. For example, the magnitude of exciting radiation generated by light sources may decrease when the light sources age and may change in a range of several tens of dBs, and in some cases even the ratio between common mode components and differential components may change to a certain extent. However, in some cases it may be required that a signal output by the encoder, for example the apparatus of FIG. 5, has an output signal strength which is in a predetermined desired range. Therefore, the embodiment of FIG. 5 includes an automatic gain control circuit 56 which adjusts the output signal level at least approximately to a desired level.

In embodiments, the automatic gain control circuit 56 may comprise a translinear mesh, for example a translinear mesh with a control loop, as already explained with reference to FIG. 1. In some embodiments, a thus implemented automatic gain control circuit 56 may have a higher linearity than conventional solutions, which is desirable, as the signal has some non-linearities introduced already at sensor level in some cases (as shown in FIG. 6, where real signal 61 has non-linearities compared to signal 60), such that it may be helpful not to introduce additional non-linearities through automatic gain control.

Figure 7:
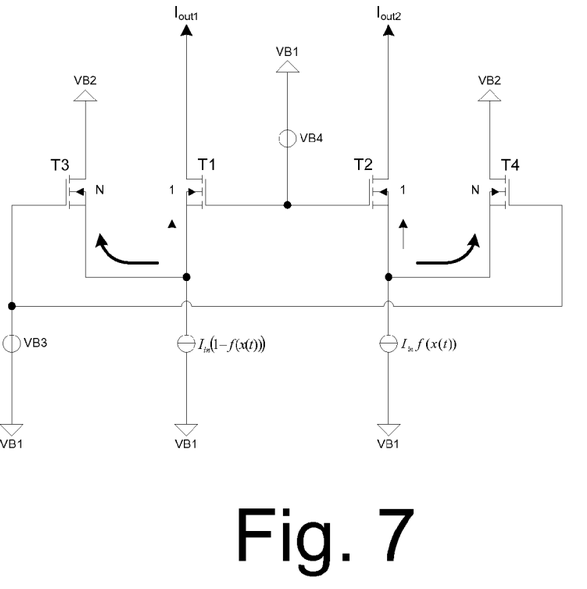
FIG. 7 is a circuit diagram of a translinear mesh of some embodiments.

An example of a translinear mesh according to an embodiment is shown in FIG. 7. In the embodiment of FIG. 7, the translinear mesh is based on N-channel MOSFET transistors T1-T4. However, in other embodiments other kinds of transistors, like other types of field-effect transistors like PMOS field-effect transistors or bipolar junction transistors like PNP or NPN transistors may be used. Gate terminals of field effect transistors and base terminals of bipolar transistors may collectively be referred to as control terminals, while collector/emitter terminals of bias bipolar transistors and source/drain terminals of field effect transistors may simply be referred to as terminals.

In the embodiment of FIG. 7, transistor T3 is scaled with respect to transistor T1 by a factor of N (i.e. dimensions of T3 like channel width or channel length are N times larger), and in a similar manner transistor T4 is scaled with respect to transistor T2 by a factor of N. Input currents delivered by a sensor arrangement are labeled $I_{in}f(x(t))$ and $I_{in}(1-f(x(t)))$, corresponding to the input currents discussed with reference to equations (1) and (2), the index in just denoting that it is an input current. VB1 to VB4 denote bias voltages. Gate electrodes of transistors T4 and T3 are biased by a bias voltage VB3, while gate electrodes of transistors T1 and T2 are biased via a bias voltage VB4. Corresponding output currents are labeled $I_{out1}$ and $I_{out2}$ in FIG. 1. VB3 and VB4 in the embodiment of FIG. 7 may be selected such that transistors T1 to T4 are operated in a weak inversion region for a desired input current range. In this case and also in an implementation with bipolar transistors, a relationship between gate source voltages and corresponding drain currents (or a relationship between base emitter voltages and collector currents in the case of bipolar transistors) is exponential. In such a case, for input currents fulfilling equation (3), when the sum of the output currents is kept constant at a value $I_{const}$, for example as will be explained further below, the following relationships are valid:

$$I_{out1} + I_{out2} = I_{const} \tag{4}$$

$$I_{out1} = I_{const}(1 - f(x(t))) \tag{5}$$

$$I_{out2} = I_{const}f(x(t)) \tag{6}$$

which relationships are valid for $$I_{const} < I_{in}. \quad (7)$$

While in an embodiment the NMOS transistors T1 to T4 are designed and biased such that they stay in weak inversion over the whole operating range, i.e. for all input currents, in other embodiments weak inversion may be left for some values of the input currents. In such cases, a linearity of the circuit is generally less than for circuits operating in weak inversion or circuits based on bipolar transistors. However, for some applications a reduced linearity may be acceptable or even desirable.

The magnitude of the sum of the two output currents $I_{out1}$, $I_{out2}$ may for example be adjusted by adjusting bias voltage VB4 accordingly. In particular, as schematically shown by arrows in FIG. 7, a part of the input current $I_{in}(1-f(x(t)))$ is forwarded via transistor T1 to form output current $I_{out1}$, while another part is "dumped" via transistor T3 to VB2. In a similar manner, a part of input current $I_{in}f(x(t))$ is forwarded via transistor T2 as output current $I_{out2}$, while another part is "dumped" via transistor T4 to VB2. The relationship between the portions forwarded to the respective output and the portions dumped to VB2 may be adjusted by adjusting VB4. Thus, by regulating VB4 accordingly, the sum of the two output currents $I_{out1}$, $I_{out2}$ may be adjusted to a desired level.

It is to be noted that in the situation described above, when for example a sensor arrangement as discussed with reference to FIGS. 2-4 is used, $I_{out1}+I_{out2}$ is twice the common mode component of the differential output signal $I_{out2}-I_{out1}$. Therefore, regulating the sum of the two output currents $I_{out1}$, $I_{out2}$ to a desired value $I_{const}$ amounts to regulating the output common mode component $(I_{out1}+I_{out2})/2$. As explained above, due to mechanical properties of the system in many sensor arrays the common mode component and the differential component have essentially a fixed ratio, and therefore setting $I_{const}$ to a desired level also determines the amplitude of the differential component at the output. Therefore, by regulating $I_{const}$ to a desired level, for example by setting bias voltage VB4 in FIG. 7 accordingly (or by setting VB3 accordingly), or by a different kind of regulation, an automatic gain control depending only on $I_{const}$ and on the ratio between common mode component and differential component of the input signal may be implemented.

As mentioned above, in some embodiments a common mode component is regulated to a desired level, thus also regulating a differential component according to the ratio between differential component and common mode component. In some embodiments, it may be desirable to be able to actively adjust this ratio between common mode component and differential component. An example of a translinear mesh suitable for such an adjustment is shown in FIG. 8.

Figure 8:
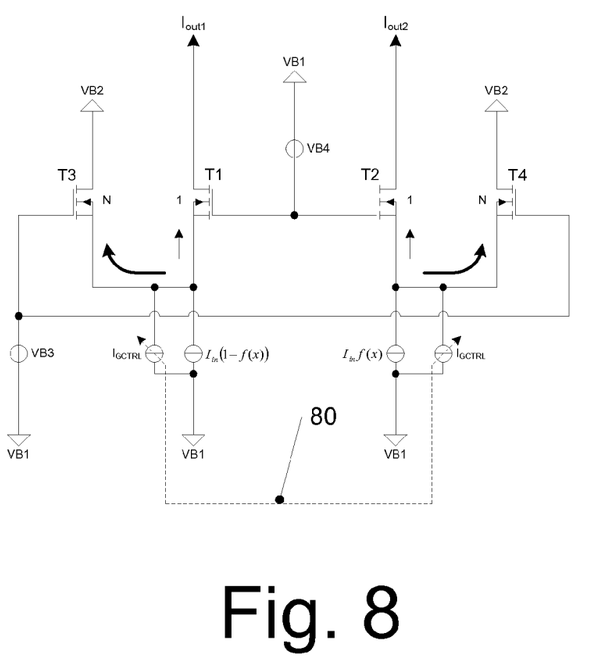
FIG. 8 is a circuit diagram of a translinear mesh according to some embodiments.

The translinear mesh of the embodiment of FIG. 8 largely corresponds to the embodiment of FIG. 7, and corresponding elements will not be described again.

Additionally, the embodiment of FIG. 8 includes controllable current sources $I_{GCTRL}$ which feed a current to the translinear mesh parallel to the input currents $I_{in}(1-f(x))$ and $I_{in}f(x)$. Controllable current sources $I_{GCTRL}$ may for example be controlled via a control signal symbolized by a dashed arrow line 80 in FIG. 8. By adjusting the current generated by controllable current sources $I_{GCTRL}$, the common mode component of the input currents may be modified by adding additional common mode current or by subtracting common mode current. Therefore, the ratio between common mode component and differential component may also be modified, and thus also the gain may be modified.

Different methods and concepts may be applied for regulating the common mode output current, i.e. $I_{out1}+I_{out2}$, to a desired value, thus determining the output signal amplitude. For example, as explained above bias voltage VB4 or a corresponding current may be modified. Further possibilities for regulation will now be described with reference to FIGS. 9 and 10.

Figure 9:
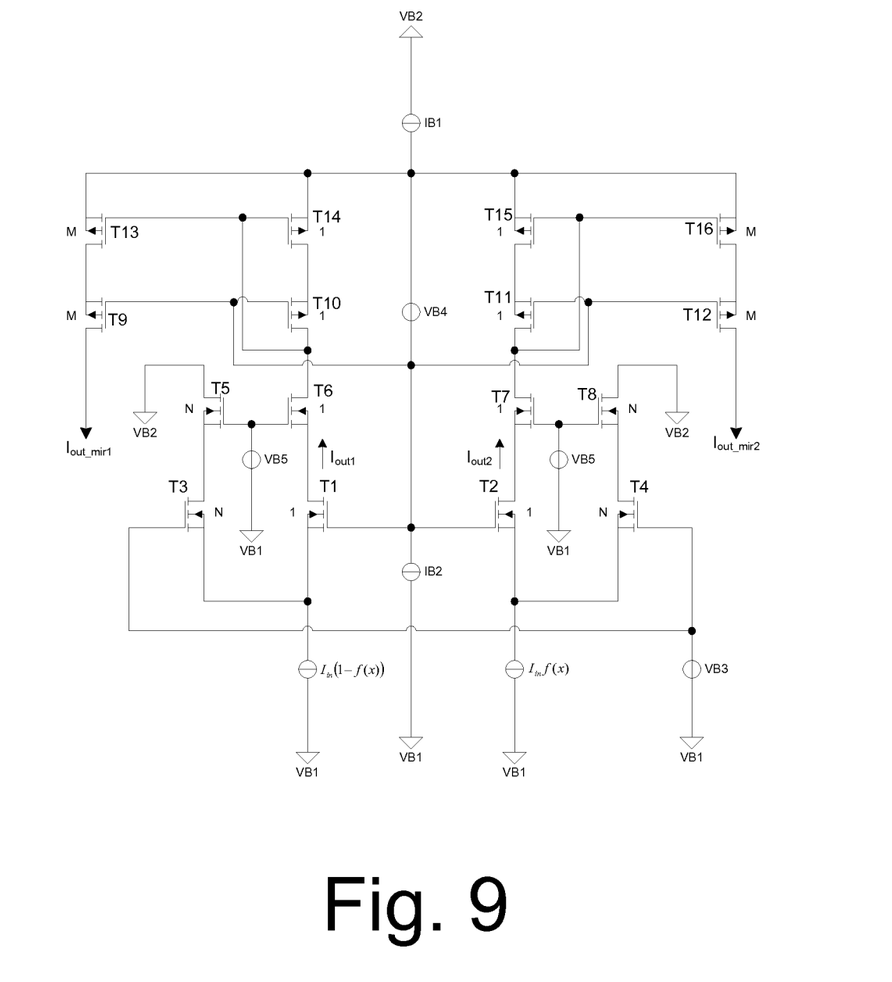
FIG. 9 is a circuit diagram of an apparatus according to an embodiment.

In FIG. 9, a translinear mesh with regulation of the common mode output current $I_{out1}+I_{out2}$ to a desired value $I_{const}$ is provided. The embodiment of FIG. 9 includes the elements already described with reference to FIG. 7, in particular transistors T1 to T4, which will not be described again in detail. Furthermore, the embodiment of FIG. 9 includes transistors T5 to T16 which are coupled with transistors T1 to T4 as shown in detail in FIG. 9. Transistor T5 is scaled by a factor of N with respect to transistor T6, and transistor T8 is scaled by a factor of N with respect to transistor T7. T5 to T8 constitute cascodes added to the translinear mesh of FIG. 7, which may have to obtain better matching in some embodiments. A cascode, as known to persons skilled in the art, is a specific transistor arrangement which can be implemented both using field-effect transistors and using bipolar transistors and corresponding to the configuration shown in FIG. 9.

Furthermore, transistors T9 and T10, T11 and T12, T13 and T14 as well as T15 and T16 each form current mirrors, the transistor labelled M being scaled by a factor M, wherein M may be equal or unequal to N, with respect to the respective other transistor labelled 1 in FIG. 9. VB5 constitutes a further bias voltage for biasing the gates of transistors T5 to T8. The output currents $I_{out1}$, $I_{out2}$ are mirrored by the current mirrors to output currents $I_{out\_mir1}$, $I_{out\_mir2}$. Furthermore, the common mode output current $I_{out1}+I_{out2}$ is regulated to $I_{const}$ in the embodiment of FIG. 9 by two current sources IB1, IB2 supplying currents $I_{B1}$, $I_{B2}$, respectively. IB2 is coupled to gate terminals T1, T2, and IB2 is coupled to terminals of T14, T15.

In the embodiment of FIG. 9, in particular $I_{out1}+I_{out2}$, i.e. the common mode component, is regulated to $I_{const}$ given by $$I_{out1} + I_{out2} = I_{const} = \frac{I_{B1} + I_{B2}}{M+1} \quad (8)$$

As can be seen, $I_{const}$ is determined by the bias currents $I_{B1}$, $I_{B2}$ and is therefore independent of the input signals. Therefore, $I_{const}$ is regulated to a desired value. The mirrored output currents $I_{out\_mir}1$, $I_{out\_mir}2$ are then $$I_{out\_mir}1 = MI_{const}(1-f(x(t))) \quad (9)$$

$$I_{out\_mir}2 = MI_{const}f(x(t)) \quad (10),$$

$I_{const}$ in equations (9) and (10) being determined by $I_{B1}$ and $I_{B2}$ as per equation (8).

Figure 10:
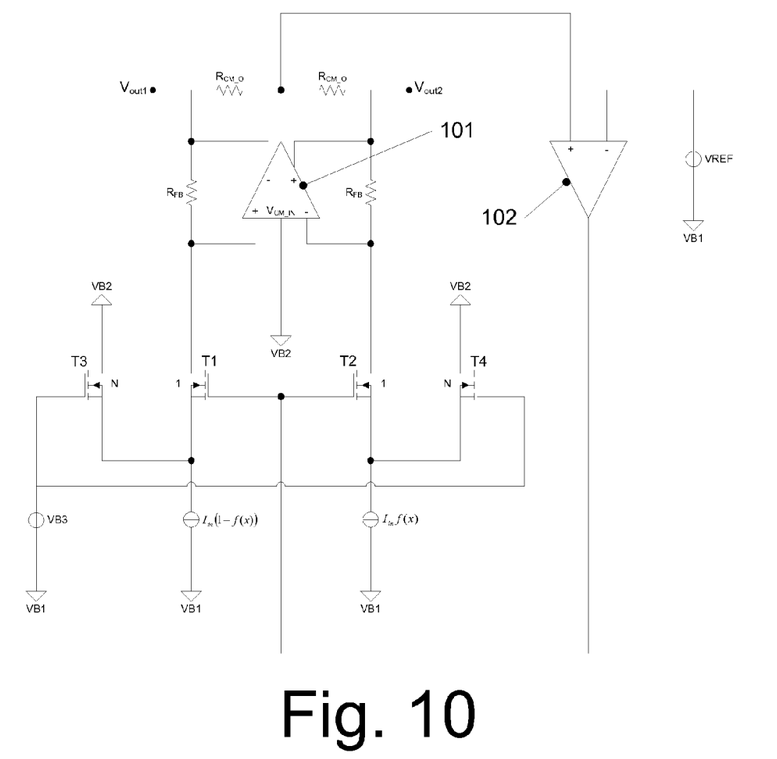
FIG. 10 is a circuit diagram of an apparatus according to an embodiment.

A further embodiment is shown in FIG. 10. Again, a translinear mesh comprising transistors T1 to T4 and receiving input currents from a sensor arrangement as discussed previously is provided. A differential transconductance amplifier 101 receives the output currents from transistors T1, T2 and converts them to a voltage signal $V_{out1}$, $V_{out2}$ Parallel to differential transconductance amplifier 101 feedback resistors $R_{FB}$ are provided. The differential output voltage is $V_{out2}-V_{out1}$.

A common mode voltage is tapped between two resistors $R_{CM\_O}$ and fed to a positive input of a difference amplifier 102. A reference voltage VREF is fed to a negative input of difference amplifier 102. An output of difference amplifier 102 biases transistors T1 and T2 (and therefore provides a voltage corresponding to the bias voltage VB4 of FIG. 7). Via difference amplifier 102 therefore a control loop is provided which regulates the common mode output voltage to VREF. This control loop sets the common mode current flowing into the resistors $R_{FB}$, i.e. $I_{const}/2=(I_{out1}+I_{out2})/2$, to $(VREF-VB2)/R_{FB}$. In other words, for the embodiment of FIG. 10 the following equations apply:

$$I_{out1} + I_{out2} = I_{const} = 2\frac{VREF - VB2}{R_{FB}} \quad (11)$$

$$V_{out1} = R_{FB}I_{const}(1 - f(x(t))) \quad (12)$$

$$V_{out2} = R_{FB}I_{const}f(x(t)) \quad (13)$$

Therefore, in this case, output voltages $V_{out1}$, $V_{out2}$ are regulated to a desired level. In case output currents are needed, $V_{out1}$, $V_{out2}$ may be converted to respective currents using voltage-to-current converters.

Figure 11:
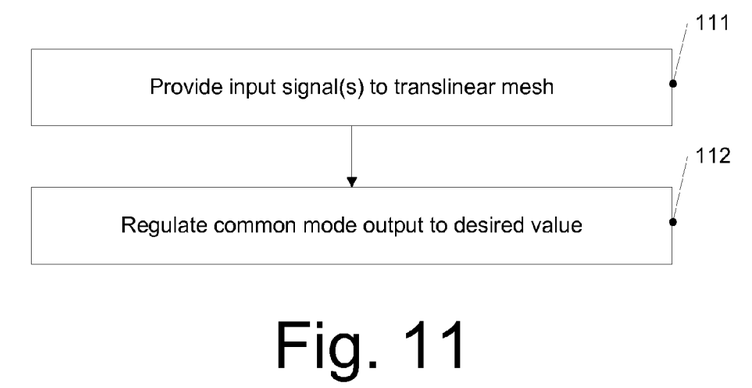
FIG. 11 is a flowchart illustrating a method according to an embodiment.

In FIG. 11, a flowchart illustrating an embodiment of a method is shown. While the method of FIG. 11 is represented as a series of acts or events, it should be noted that the acts or events described do not have to be performed in the order shown and may also be performed in a different order or concurrently with each other.

At 111, one or more input signals are provided for example from a sensor arrangement to a translinear mesh.

At 112 a common mode output of the translinear mesh is regulated to a desired value, for example using a control loop.

The method of FIG. 11 may for example be implemented using the embodiments described with reference to FIGS. 1-10.

As can be seen from the above detailed description, various modifications and alterations are possible without departing from the scope of the invention. Therefore, the above-described embodiments are not to be construed as limiting the scope in any way, but are merely intended to provide illustrative implementation examples. Moreover, modifications and alterations described for one of the embodiments may also be applied to other embodiments described unless specifically noted otherwise.

The invention claimed is:

1. An apparatus, comprising:
a signal input;
a sensor arrangement that includes a first array of sensors and a second array of sensors, wherein sensors of said first array are arranged in an interleaving manner with sensors of said second array, and an output of said sensor arrangement is coupled to said signal input;
a translinear mesh, wherein an input of said trans near mesh is coupled to said signal input; and
a control circuit that is configured to regulate a common mode component of signals output at an output of said translinear mesh to a predetermined value, wherein said control circuit is a loop coupled to said translinear mesh.

2. The apparatus of claim 1, wherein the input of the translinear mesh is a differential input and the output of the translinear mesh is a differential output.

3. The apparatus of claim 1, wherein the common mode component is regulated to a value that is independent from a common mode component at the signal input.

4. The apparatus of claim 2, wherein said output of said sensor arrangement comprises a first sensor output and a second sensor output, said sensor arrangement is configured to output a first signal at said first sensor output and a second signal at said second sensor output, and wherein said first signal increases when said second signal decreases and said first signal decreases when said second signal increases.

5. The apparatus of claim 1, wherein said signal input comprises:
a first signal input and a second signal input; and
wherein said translinear mesh comprises:
a first transistor that includes a first terminal coupled to said first signal input, a second terminal of said first transistor coupled to a first signal output, and a control terminal; and
a second transistor that includes a first terminal coupled to said second signal input, a second terminal coupled to a second signal output, and a control terminal.

6. The apparatus of claim 5, wherein said control terminal of said first transistor is coupled to said control terminal of said second transistor.

7. The apparatus of claim 6, further comprising:
a third transistor that includes a first terminal coupled to said first signal output, a second terminal coupled to a first biasing voltage, and a control terminal coupled to a second biasing voltage; and
a fourth transistor that includes a first terminal of coupled to said second signal input, a second terminal coupled to said first biasing voltage, and a control terminal coupled to said second biasing voltage.

8. The apparatus of claim 7, wherein said third transistor is scaled by a factor of N with respect to said first transistor, and said fourth transistor is scaled by a factor of N with respect to said second transistor.

9. The apparatus of claim 5, further comprising a first cascode transistor arrangement coupled to said first signal output and a second cascode transistor arrangement coupled to said second signal output.

10. The apparatus of claim 5, further comprising a first biasing current coupled to said control terminals of said first and second transistors.

11. The apparatus of claim 5, further comprising a first current mirror coupled to said first signal output and a second current mirror coupled to said second signal output.

12. The apparatus of claim 6, further comprising a third current mirror coupled in parallel to said first current mirror and a fourth current mirror coupled in parallel to said second current mirror.

13. The apparatus of claim 12, further comprising a second biasing current coupled to voltage terminals of said third and fourth current mirrors.

14. The apparatus of claim 11, wherein said first current mirror includes a first transistor pair, a first transistor of said first transistor pair being scaled by a factor of M with respect to a second transistor of said first transistor pair, and wherein said second current mirror includes a second transistor pair, the first transistor of said second transistor pair being scaled by a factor of M with respect to a second transistor of said first transistor pair.

15. The apparatus of claim 5, further comprising a differential transconductance amplifier, a first input of said differential transconductance amplifier being coupled to said first signal output and a second input of said differential transconductance amplifier being coupled to said second signal output, a first output of said differential transconductance amplifier being coupled to a first voltage output and a second output of said differential transconductance amplifier being coupled to a second voltage output.

16. The apparatus of claim 15, further comprising a difference amplifier, a first input of said difference amplifier being coupled to a node between said first voltage output and second voltage output, a second input of said difference amplifier being coupled to a reference voltage and an output of said difference amplifier being coupled to said control input of said first transistor and said control input of said second transistor.

17. The apparatus of claim 1, further comprising at least one adjustable current source coupled to said signal input.

18. The apparatus of claim 1, wherein the common mode component is a voltage or a current.

19. The apparatus of claim 1, wherein the common mode component is the common mode voltage of interleaving output signals of the translinear mesh.

20. The apparatus of claim 1, wherein the common mode component is the common mode voltage of interleaving output signals.

21. A method comprising:
providing an input signal to a translinear mesh; and
regulating a common mode component of an output of said translinear mesh to a predetermined value, the regulating performed by a single-ended output of a control loop coupled to a feedback input of the translinear mesh.

22. The method of claim 21, wherein providing input signals includes capturing a motion using a motion sensor, and providing input signals corresponding to the captured motion to the translinear mesh.

\* \* \* \* \*

UNITED STATES PATENT AND TRADEMARK OFFICE
CERTIFICATE OF CORRECTION

PATENT NO. : 9,628,036 B2
APPLICATION NO. : 14/083265
DATED : April 18, 2017
INVENTOR(S) : Dieter Draxelmayr and Simone Fabbro It is certified that error appears in the above-identified patent and that said Letters Patent is hereby corrected as shown below:

In the Claims

Column 11, Line 53, Claim 1: Replace "..wherein an input of said trans near mesh.." with -- wherein an input of said translinear mesh --

Column 12, Line 44, Claim 12: Replace "The apparatus of claim 6,.." with -- The apparatus of claim 11, --

Signed and Sealed this
Fifth Day of September, 2017

Joseph Matal
*Performing the Functions and Duties of the*
*Under Secretary of Commerce for Intellectual Property and*
*Director of the United States Patent and Trademark Office*